(12) United States Patent
Johnston

(10) Patent No.: US 6,414,504 B2
(45) Date of Patent: *Jul. 2, 2002

(54) COAXIAL TILT PIN FIXTURE FOR TESTING HIGH FREQUENCY CIRCUIT BOARDS

(75) Inventor: Charles J. Johnston, Walnut, CA (US)

(73) Assignee: Delaware Capital Formation, Inc., Wilmington, DE (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/315,580

(22) Filed: May 20, 1999

(51) Int. Cl.⁷ .............................................. G01R 31/02
(52) U.S. Cl. ....................... 324/761; 324/754; 324/755; 324/758
(58) Field of Search ................................ 324/761, 754, 324/755, 758, 158.1, 72.5, 73.1, 757

(56) References Cited

U.S. PATENT DOCUMENTS

| 4,626,776 A | | 12/1986 | Wilkinson ..................... 324/73 |
| 4,721,908 A | | 1/1988 | Driller et al. ................. 324/158 |
| 4,739,259 A | * | 4/1988 | Hadwin et al. ............... 324/761 |
| 4,764,722 A | * | 8/1988 | Coughlin et al. ............ 324/758 |
| 4,908,576 A | | 3/1990 | Jackson ....................... 324/73.1 |
| 4,963,822 A | * | 10/1990 | Prokopp ..................... 324/754 |
| 5,134,363 A | | 7/1992 | Lang-Dahlke ............... 324/158 |
| 5,175,493 A | * | 12/1992 | Langgard .................... 324/761 |
| 5,216,358 A | | 6/1993 | Vaucher ...................... 324/158 |
| 5,399,982 A | | 3/1995 | Driller et al. ............... 324/754 |
| 5,442,299 A | * | 8/1995 | Caggiano .................... 324/758 |
| 5,493,230 A | * | 2/1996 | Swart et al. ................. 324/754 |
| 5,534,787 A | * | 7/1996 | Levy ........................... 324/761 |
| 5,729,146 A | | 3/1998 | Swart ......................... 324/754 |
| 5,767,692 A | * | 6/1998 | Antonello et al. ........... 324/761 |
| 5,773,988 A | * | 6/1998 | Sayre et al. ................. 324/761 |
| 5,949,243 A | * | 9/1999 | Grasso ........................ 324/761 |
| 5,952,843 A | * | 9/1999 | Vinh ........................... 324/761 |
| 6,024,579 A | * | 2/2000 | Bennett ....................... 439/66 |
| 6,025,729 A | * | 2/2000 | Van Loan et al. ........... 324/755 |
| 6,037,787 A | * | 3/2000 | Corwith ....................... 324/754 |
| 6,127,835 A | * | 10/2000 | Kocher et al. ............... 324/761 |
| 6,160,412 A | * | 12/2000 | Martel et al. ................ 324/761 |
| 6,191,601 B1 | * | 2/2001 | Swart .......................... 324/761 |

OTHER PUBLICATIONS

Semi–Rigid, "Micro–Coax Introduction" 1998 (Two pages).

\* cited by examiner

*Primary Examiner*—Safet Metjahic
*Assistant Examiner*—T. R. Sundaram
(74) *Attorney, Agent, or Firm*—Christie, Parker & Hale, LLP

(57) ABSTRACT

A translator fixture for use in testing high frequency or high speed digital circuit boards. The fixture has a pin supporting top plate and base plate and coaxial constant impedance test pins incorporated into the fixture to provide a signal path from a test analyzer to the circuit board under test. The board under test is coupled to an upper surface of the top plate. The impedance of the coaxial pins is matched to the impedance of the board under test as well as the impedance of the test analyzer. Force exerted on the coaxial pins ensures contact of the pins with test points on the circuit board under test. The force may be exerted by spring loaded probes mounted on a compliant test interface below the base plate. The force may also be exerted by Euler buckling the pins by relative movement between the circuit board under test and a second circuit board coupled to the base plate or to the test analyzer.

30 Claims, 4 Drawing Sheets

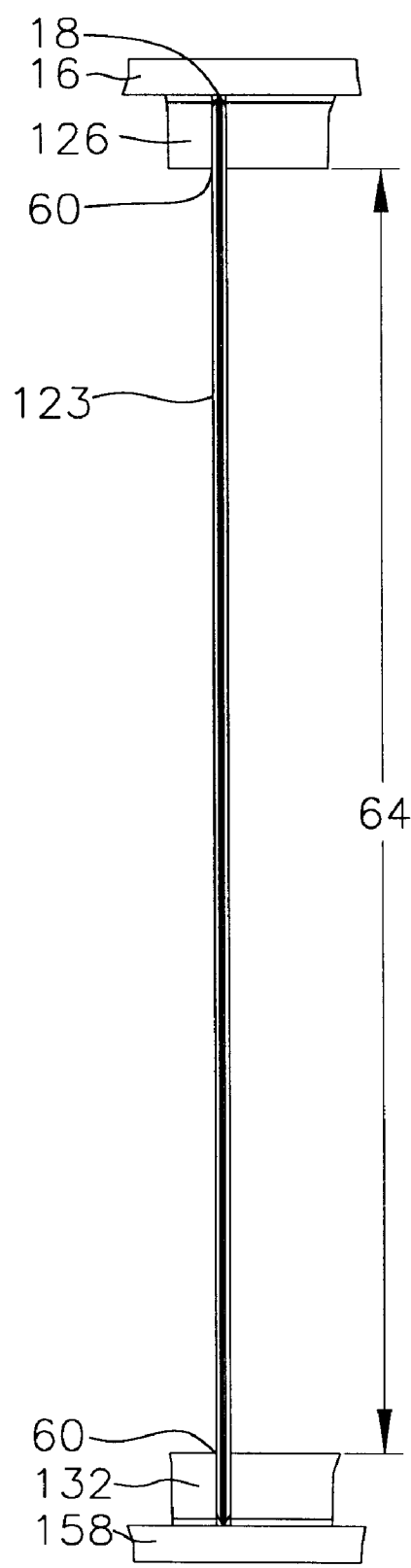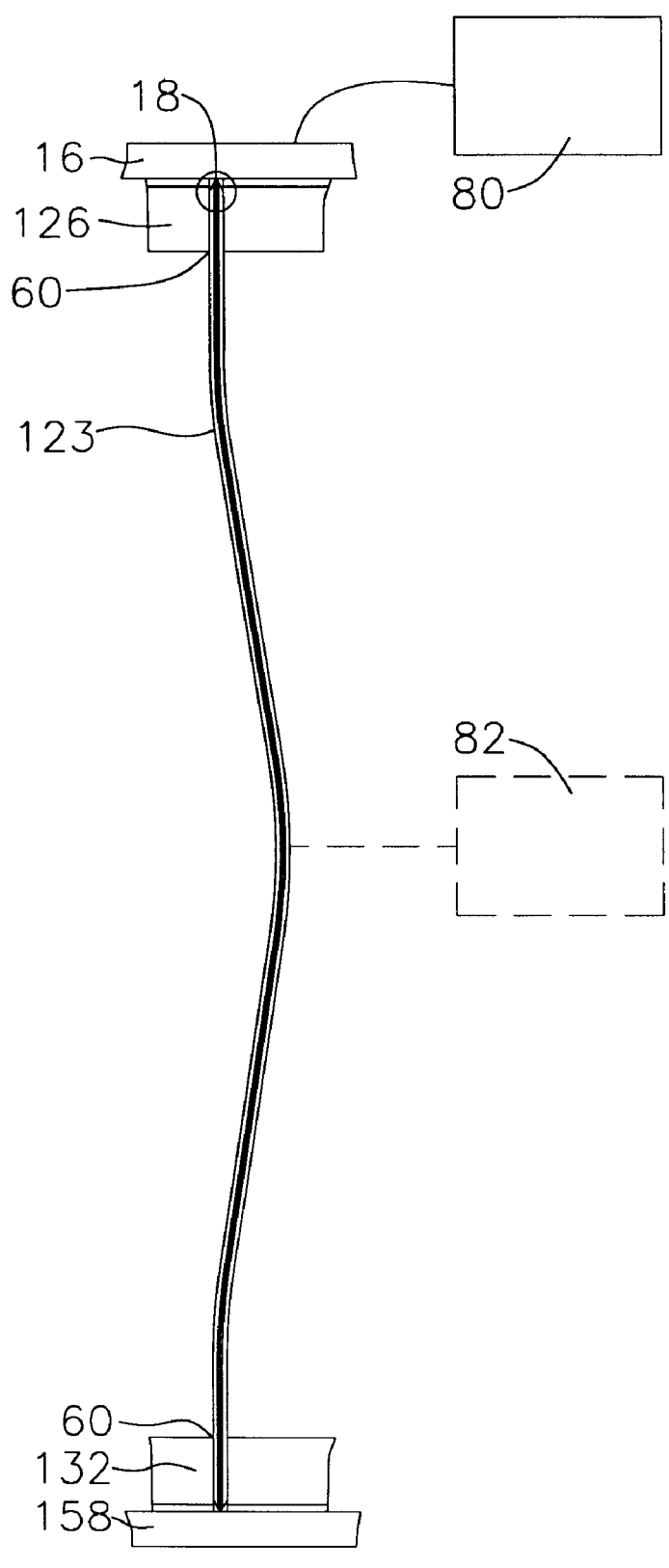

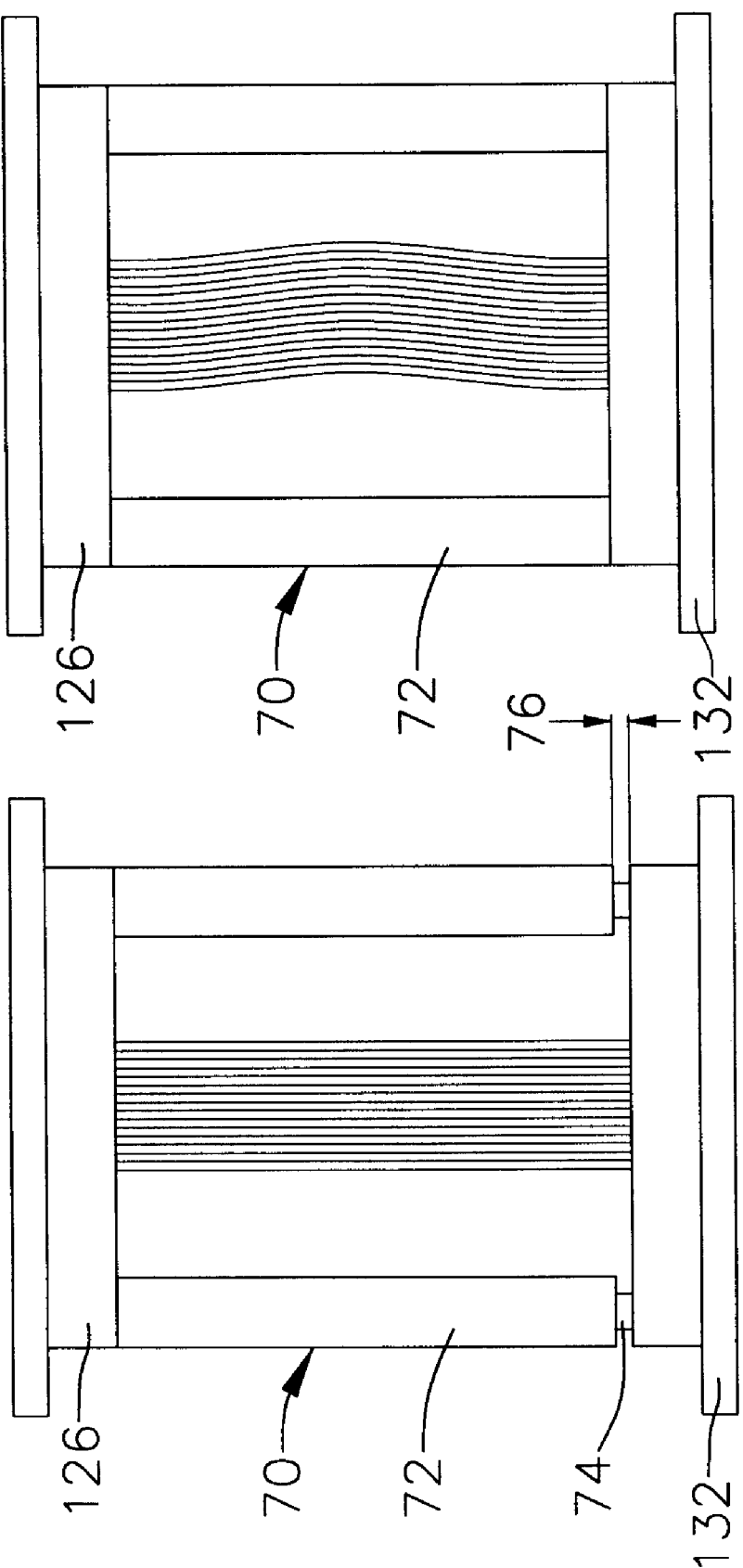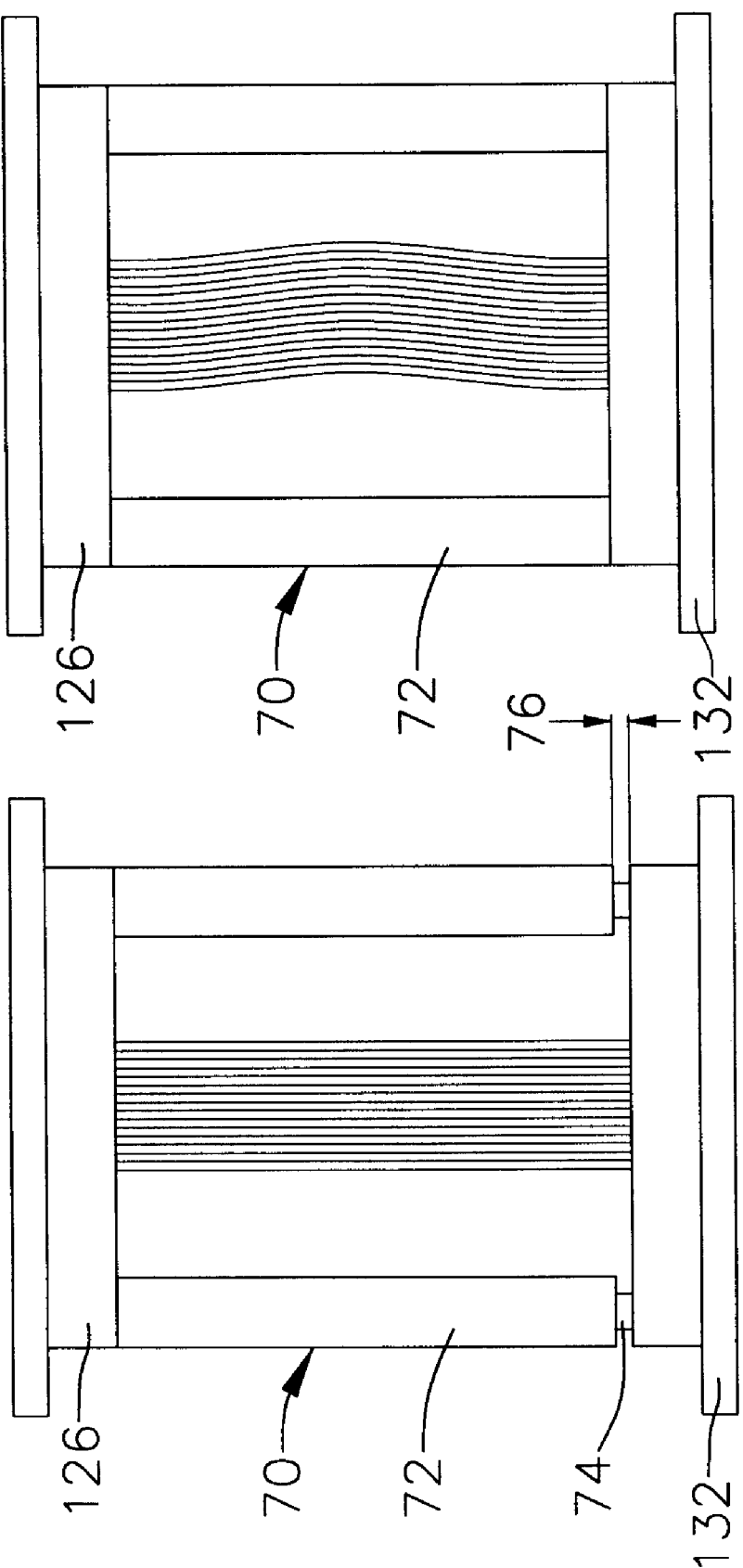

COAXIAL TILT PIN FIXTURE FOR TESTING HIGH FREQUENCY CIRCUIT BOARDS

FIELD OF THE INVENTION

This invention relates to the automatic testing of high frequency or high speed printed digital circuit boards and of components mounted on such boards, and more particularly to a matched impedance translator fixture used to translate test signals from a test analyzer to such circuit boards or components.

BACKGROUND OF THE INVENTION

Automatic test equipment for checking printed circuit boards has long involved use of a "bed of nails" test fixture or interconnect in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking is selected, and a corresponding array of test probes is configured in the test fixture. This typically involves drilling a pattern of holes in a probe plate to match the customized array of test probes and then mounting the test probes in the drilled holes on the probe plate forming a compliant test interface or probe field. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

A typical class of test fixtures is the so called "grid type" class of test fixtures in which the random pattern of test points on the board are contacted by translator pins which transfer test signals to interface pins arranged in a grid pattern in a receiver. A typical grid fixture includes a grid type of compliant test interface or probe field which typically includes equidistantly spaced openings forming a predetermined pattern. This type of compliant test interface because of its predetermined pattern of openings forming a grid is commonly referred to as a grid or grid base. The grid-type test fixture contains test electronics with a huge number of switches connecting test probes fitted in the grid base openings to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the UUT to the grid pattern of test probes in the grid base.

Other types of test fixtures include test fixtures that are not of the "grid type." These fixtures incorporate a compliant test interface having openings in pattern different from the standard grid patterns. For example, the openings may not be equidistantly or uniformly spaced forming "off-grid patterns." Tilt pins are used with these fixtures to translate the test signals from the off-grid pattern on the compliant test interface to the off-grid pattern on the UUT. The off-grid pattern on the UUT is different from the off-grid pattern on the compliant test interface. Typically, the spacing between test points on the UUT may be shorter than the spacing between corresponding probes on the compliant test interface.

A recent approach uses a translator pin retention system for a translator fixture for a printed circuit board tester having a pattern of test probes facing away from a base plate upon which the translator fixture is mounted. The fixture comprises a plurality of essentially parallel and spaced apart translator plates having patterns of preformed holes for containing and supporting translator pins extending through the plates of the translator fixture for use in translating test signals between test points on a printed circuit board supported by the fixture and the probes on the base of the tester. A thin, flexible pin retention sheet comprising an elastomeric material is positioned above a surface of one of the translator plates so that the translator pins carried by the translator fixture extend through the pin retention sheet. The elastomeric pin retention sheet naturally applies a compression force around the translator pins. This compression force retains the pins in the fixture when the fixture is lifted or turned upside down. The compression force acting on the pins allows the pins to move with the retention sheet independently of the other pins and the translator plates of the fixture. This essentially avoids drag forces or any restriction to compliant axial movement of the pins within the fixture. Such a pin retention sheet is described, for example, in U.S. Pat. No. 5,493,230, which is incorporated herein by this reference.

Testing of high frequency or high speed digital UUTs requires that the impedance of the test source (i.e., the test source providing the electrical signals) is matched to the impedance of the load (i.e., the UUT) in order to avoid attenuation of the high frequency signals. Moreover, the impedance of the interconnect between the UUT and test analyzer must also be matched to the impedance of the source and to the impedance of the load. The problem with present translator fixtures incorporating pins is that the characteristic impedance of the pins may vary from pin to pin. Such impedance variation is caused by the variance in the spacings between a set of two pins (i.e., a signal pin and a ground pin) used to test a set of test points. This variance is caused by the fact that the spacing between sets of test points to be tested on the UUT is different than the spacing between corresponding probes on the compliant test interface. In essence, each set of pins forms a capacitor with the air being the capacitor's dielectric. Since the spacing of one set of pins may vary from the spacing another set of pins, so does the capacitance between each set and hence the impedance of the pins of each set. As such, current translator fixtures incorporating pins are not suited for testing high frequency or high speed UUTs.

Currently, high frequency or high speed digital UUTs, such as digital circuit boards, digital circuit boards with mounted components, or individual components are typically tested using test sockets. Typically, short spring probes are fitted in cavities formed through the thickness of the socket. A contact side of the UUT is brought into pressure contact with the tips of the spring probes protruding through a side of the socket. A contact plate connected to the test analyzer is brought into contact with the tips of the spring probes protruding through an opposite side of the socket. The test analyzer transmits high frequency test signals to the contact plate from where the signals are transmitted through the spring probes to the UUT. However, because the spacing between spring probe centers in a socket is limited by the physical dimensions of the spring probes, e.g., the spring probe diameter, this type of test setup cannot be used to test UUTs having contact points whose center spacing is relatively short. Moreover, as the spacing between probes is decreased impedance matching may become infeasible. In order to minimize the effects of impedance mismatch as the spacing between the probes is decreased, the length of the probes must be minimized. It is believed that matched impedance test setups are limited to testing UUTs having contact points whose center spacing is not less than 0.07 inch.

Many prior art fixtures require some mechanical means, such as spring loaded probes, for exerting a compliant force on the pins to ensure proper contact with the test point on the UUTs. The disadvantage of such fixtures is that they have moving parts which are prone to early failure.

The present invention is based on a recognition of a need for a matched impedance interconnect which can be used for testing high frequency UUTs having a contact point center spacing that is less than 0.07 inch. Moreover, the invention is based on a recognition of a need for such a translator fixture which does not incorporate mechanical means such as spring probes for exerting a compliant force on the pins in the translator fixture.

SUMMARY OF THE INVENTION

The present invention is directed to a translator fixture or interconnect for testing high frequency or high speed digital circuit boards or unit under test ("UUT"). The invention comprises a translator fixture having a top and a base spaced apart grounded support plates, each plate having pin openings formed through its thickness. In one embodiment, there are four support plates positioned between the top and base plates, although the number may vary. The UUT interfaces with an upper surface of the top plate. The top plate has pin openings corresponding to a set of test points on the UUT. The base plate interfaces with a compliant test interface (or probe field) having an array of spring loaded test probes arranged in a grid or an off-grid pattern. The base plate openings correspond to this spring probe pattern. The probe pattern is typically different from the pattern formed by the set of test points on the UUT. A second circuit board is coupled to the test analyzer and to the compliant test interface.

Coaxial pins are used to provide a signal path from the test analyzer to test points on the UUT which may have centers which are spaced apart at distances of less than 0.07 inch and even less than 0.025 inch. Coaxial pins consist of a signal pin which is surrounded by a shield. The signal pin is separated from the shield by a dielectric material. The shield serves as a ground. The spacing between the signal pin and the shield for each pin used is the same. As a result, each coaxial pin has the same impedance.

The tips of the coaxial pins are ground to a point such that the signal pins extend beyond their corresponding shields. One end of the coaxial pin penetrates the opening on the top plate, while the other end penetrates the opening on the base plate and is in contact with a predetermined spring loaded test probe in the compliant test interface. The spring loaded test probe applies a compliant force against the coaxial pin to ensure a positive contact with the test point on the UUT. Signals from the test analyzer are transferred via the second circuit board through the spring loaded test probes and through the coaxial pins to the test points on the UUT. Ground pins may also used to connect ground points on the UUT with grounded spring loaded test probes in the compliant test interface.

The impedance of the coaxial pins, ground pins, coaxial test probes, UUT, the test analyzer and interfacing circuit board are matched. The impedance of the probes in the compliant test interface is a function of the spacing between adjacent signal and ground probes. The matching of impedances allows the interconnect to be used in testing high frequency or high speed digital circuit boards.

In another embodiment, the translator fixture does not incorporate any spring loaded probes and thus does not interface with a compliant test interface. Rather, the UUT is interfaced with the top plate. A second circuit board, which is coupled to the test analyzer, is interfaced with the bottom plate. Coaxial pins provide the signal path between the second and first circuit boards. During testing, the two circuit boards are moved toward each other, either by applying a vacuum or by mechanical means, causing the coaxial pins to buckle, preferably under Euler buckling. The buckling of the pins causes them to exert a compliant force against the two circuit boards, thereby ensuring a positive contact between the pin and the test points on the UUT and the appropriate points on the second circuit board. The points on the second board may form a grid or an off-grid pattern.

With this embodiment, the top plate is separated from the base plate using two-piece posts. Each two-piece post comprises a first member slidably engaged to a second member. One member is coupled to the top plate and the other member to the base plate. Prior to buckling of the pins, the first member does not span the entire distance between the two plates. A gap exists between the first member and one of the plates. As the two circuit boards are moved toward each other, the pins buckle. Simultaneously, the gap formed between the first member and one of the plates is eliminated. Hence, the initial width of the gap controls the amount of travel between the two circuit boards toward each other, and thus, the amount of bucking of the pins. The spacing between the signal pin and the shield of each coaxial pin remains unchanged even when the coaxial pin is buckled. Consequently, the impedance of the coaxial pins remains constant even when buckled.

By changing the spacing between openings in the compliant test interface or test analyzer circuit, the pins may be tilted sufficiently to provide an interconnect to contact points on the UUT whose centers are spaced apart by a distance of less than 0.07 inch and even less than 0.025 inch. Moreover, because the coaxial pins allow for impedance matching, the interconnects of the present invention can be used to test high frequency UUTs.

These and other aspects of the invention will be more fully understood by referring to the following detailed description and the accompanying drawings.

DESCRIPTION OF THE DRAWINGS

FIG. 4A is a fragmentary cross-sectional view of a translator fixture incorporating coaxial rigid pins without spring loaded probes.

FIG. 4B is a fragmentary cross-sectional view of the translator fixture of FIG. 4A with the coaxial pins buckled.

FIG. 5A is a front elevation view of the translator fixture of FIG. 4A.

FIG. 5B is a front elevation view of the translator fixture shown in FIG. 4B.

DETAILED DESCRIPTION OF THE INVENTION

Figure 1:
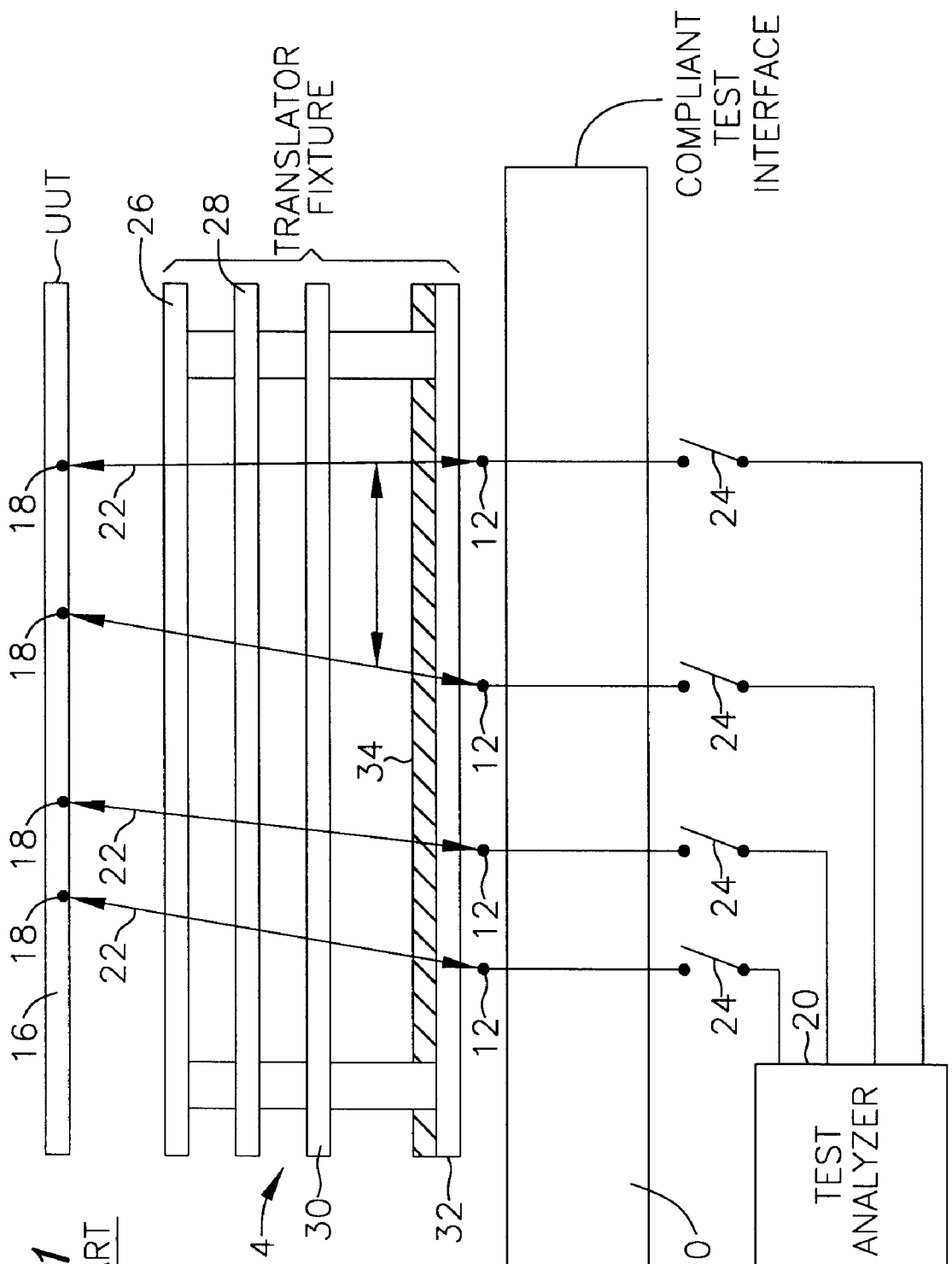
FIG. 1 is a schematic block diagram illustrating components of a tester and a translator fixture with pin retention means according to principles of this invention.

Referring to the schematic block diagram of FIG. 1, a circuit board tester includes a compliant test interface plate or probe field (referred to herein as the "compliant test interface") 10 having an array of spring-loaded test probes 12 arranged on a two-dimensional pattern. This pattern may be a grid pattern consisting of an array of uniformly spaced apart rows and columns of test probes or may be an off-grid pattern, i.e., a pattern that does not consist solely of uniformly spaced apart test probes. The test probes 12 comprise spring-loaded plungers which project above the surface of the compliant test interface, typically uniformly across the array of probes. A translator fixture or interconnect 14 supports a high frequency or high speed printed circuit board 16, or a circuit board with mounted components, or an individual component or grouping of individual components under test (also referred to herein as a "unit under test" or "UUT"). A translator fixture serves as an interface between an array of test points 18 on the board wider test and the test probes 12 in the compliant test interface. An external electronic test analyzer 20 is electrically connected to the test points in the board under test through test probes in the translator fixture. These test probes (of which there can be several types) are illustrated generally at 22.

The test analyzer 20 contains electronic interrogation circuits to electronically interrogate separate test points 18 of the UUT to determine the high frequency characteristics of the electrical connection between any two given test points. The high frequency characteristics detected between test points on the UUT are electronically compared with stored reference results obtained from a previous interrogation of test points of a faultless master printed circuit board. The tested board is good if test results match the stored reference results, but if any problem exists in the circuits on the board, the problem is detected by the test results and the bad boards then can be separated from the good boards.

Electronic interrogation circuits may comprise a plurality of printed circuit cards having electronic components and printed circuits for carrying out the electronic testing. Each test probe used in the test procedure may be coupled to the test electronics through a corresponding switch 24 leading to the test analyzer. In a grid-type tester (i.e., a tester comprising a compliant test interface having a grid pattern of openings to accommodate the test probes) incorporating switches, there can be as many as 40,000 switches available for testing the various test points in a board under test. These switches are preferably incorporated in one or multiple circuit boards.

Figure 2:
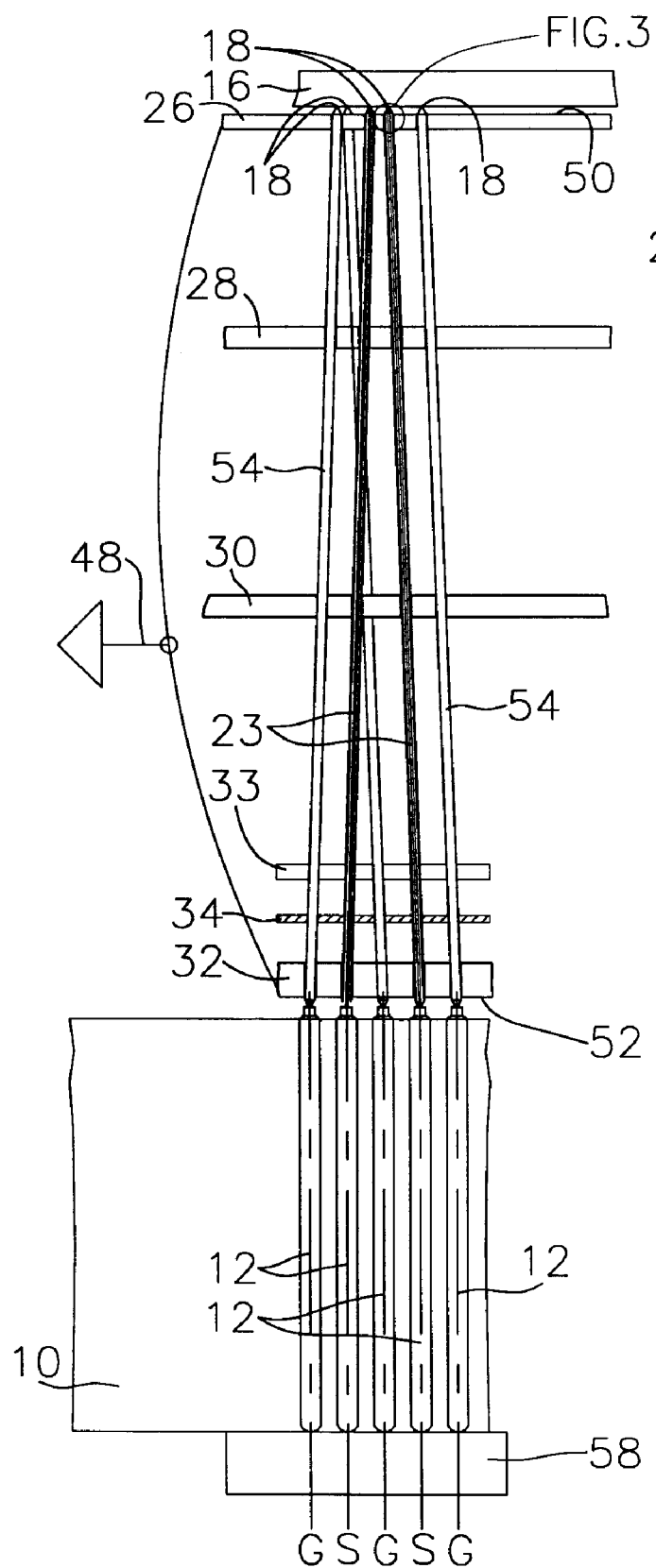
FIG. 2 is a fragmentary cross-sectional view of a translator fixture incorporating coaxial rigid pins.

The translator fixture 14 includes a series of vertically spaced-apart and parallel translator support plates which may include a top plate 26, an upper plate 28 spaced a short distance below the top plate, a middle plate 30 at approximately an intermediate level of the translator fixture, and a base plate 32 at the bottom of the translator fixture. In a preferred embodiment, an additional lower support plate 33 may be incorporated between the middle and the base plates (FIG. 2). The translator plates are supported in parallel vertically spaced apart positions by rigid posts 35 that hold the fixture together as a rigid unit. The fixture also includes an array of standard translator pins such as tilt pins represented schematically at 22 extending through the translator plates 26, 28, 30 and 32. FIG. 1 illustrates only a few of the standard tilt pins for simplicity. The tilt pins extending through the base plate 32 of the translator fixture are in alignment with the pattern of test probes 12 in the compliant test interface 10. The top portions of the tilt pins, which extend through the top plate 26, are in an off-grid pattern aligned to match the random pattern of test points 18 on the UUT. Thus, the tilt pins can be tilted slightly and various three dimensional orientations that can be used in order to translate between the probe pattern at the compliant test interface and the off-grid pattern at the top. Because they are tilted, tilt pins are able to contact test points on the UUT whose centers are spaced at less than 0.07 inch. By tilting the pins, instead of keeping them parallel relative to each other, the points of the pins may be brought much closer together.

The standard tilt pins pass through holes in the base, lower, middle, upper, and top plates. The holes in each of the translator plates are drilled in patterns controlled by standard computer-operated software according to well-known procedures for aligning the tilt pins in the various orientations to translate between the probe pattern at compliant test interface and the off-grid pattern at the UUT.

The tilt pins also extend through a flexible pin retention sheet 34 comprising a common sheet of a thin, flexible elastomeric material located over the base plate (and below the lower plate in a preferred embodiment) of the translator fixture. The pin retention sheet is described in the aforementioned U.S. Pat. No. 5,493,230.

The present invention is directed to the testing of high frequency or high speed digital UUTs using translator fixtures with tilt pins. Applicant has discovered that use of tilt pins allow for the testing of UUTs whose contacts have close centers, i.e., the spacing between the centers of two contacts is less than 0.07 inch and even less than 0.025 inch. High frequency testing encompasses testing at frequency levels exceeding 100 MHz with a testing bandwidth exceeding 1 GHz. It is not uncommon to test at frequencies in the 1–2 GHz range and even in the 4 GHz range. To avoid attenuation of the high frequency signals, the impedance of the source (i.e., the test circuit) is matched to the impedance the load (i.e., the UUT). This requires that the impedance of the tilt pins and the impedance of the spring loaded probes match the impedance of the load. The impedance of conventional tilt pins mounted in a translator fixture may vary from pin to pin. This is due to the variance in the spacing between a test signal pin and an adjacent ground pin in each set of pins used to test a set of test points on the UUT. In essence, the adjacent pins form a capacitor with the air acting as the dielectric. Since the spacing from pin set to pin set varies, so does the capacitance, and hence the pin impedance. The present invention overcomes this problem via use of a translator fixture having rigid coaxial pins as shown in FIG. 2.

Figure 3:
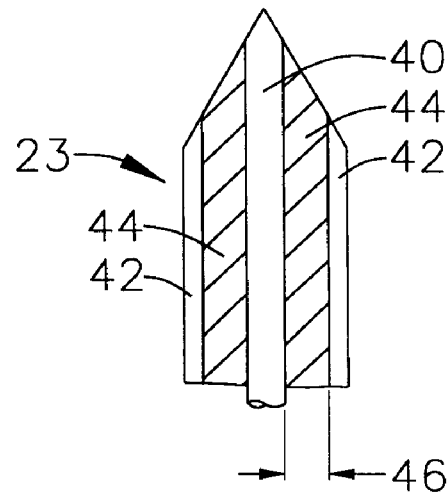
FIG. 3 is a cross-sectional view of a coaxial pin.

Coaxial pins 23 consist of a center signal pin 40 surrounded by a ground shield 42 (FIG. 3). A dielectric 44 separates the signal pin from the shield. The radial distance 46 between the signal pin and shield, and therefore the radial thickness of the dielectric, is constant from one end of the pin to the other. Thus, a coaxial pin is tailored to have a specific impedance. According to the present invention, the coaxial pins contained in the translator fixture have substantially the same impedance. In one embodiment, the impedance of both the load and the UUT is 50 ohms. Thus, in this embodiment, the impedance of the coaxial pins is also 50 ohms.

The tips of the coaxial pins are ground to a point such that each signal pin 40 extends beyond the shield. Moreover, by having pointed ends, the end points of the coaxial pins can be brought closer together by tilting, allowing them to make contact with points on a UUT that are spaced less than 0.025 inch apart.

When positioned in the translator fixture, one end of the coaxial pin shield terminates at the upper surface 50 of the top plate, while the other end terminates at the lower surface 52 of the base plate. The top and base plates are ground plates and are typically both connected to an electrical ground using a low loss ground connection 48. The signal pins protrude beyond the top plate to contact the UUT and beyond the base plate to contact the signal carrying spring loaded probes, respectively. The spring loaded probes exert a compliant force on the pins to ensure a positive contact with the test points on the UUT.

Ground pins 54 may be used to contact ground test points on the UUT and the grounded spring loaded probes (also referred to as the "ground probes") in the compliant test interface. The impedance of the ground pins is also matched to the impedance of the source, load and coaxial pins. The impedance of the signal and ground probes is a function of the spacing of the probes in the compliant test interface. Since the impedance of the coaxial pins is not affected by the spacing between pins, the spacing of the probes in the compliant test interface can be easily tailored to yield to desired probe impedance and to accommodate reasonably sized spring loaded probes.

In a preferred embodiment, an interface circuit board 58 interfaces the spring loaded probes to the test equipment. In this embodiment, the signal pins 23 communicate with signal points on the interface circuit board 58. The impedance of the circuit board 58 is also matched to the impedance of the load. Thus, a circuit is completed from the test equipment through the interface circuit board, through a signal probe, through a test point on the UUT, through a ground test point on the UUT, and through a ground pin to ground. Alternatively, the ground test points on the UUT may be grounded directly to the top plate, thus alleviating the need for ground pins.

In another embodiment, a translator fixture comprises a top plate 126 and a base plate 132 without use of intermediate plates (FIG. 4A). The top plate interfaces with the UUT 16 while the base plate interfaces with a test analyzer interface circuit board 158. As with the previous embodiment, the top and base plates are grounded. Each of the plates has openings 60 penetrating their entire thickness. For convenience the top and base plates are shown in FIG. 4A as having one opening 60. The top plate openings are aligned with the test points on the UUT. The base plate openings are aligned with signal points on the interface circuit board. They may also be aligned with ground points on the interface circuit board. The ground points on the interface circuit board and the ground test points on the UUT may directly contact the ground base and top plates, respectively.

Coaxial tilt pins 123 have one end fitted into an opening in the base plate and one end fitted into the opening in the top plate so as to provide the requisite signal path between the test analyzer and UUT. Because the tips or ends of the coaxial tilt pins are ground to preferably a conical shape allowing the center signal pins to extend beyond the shields, only the points of the signal pins make contact with the test points on the UUT and the signal points on the interface circuit board. The shields contact the circumferential walls of openings 60 in the top and base plates. Ground pins in the form of tilt pins may also be used in situations where the ground points on the UUT are not ground to the top plate.

The top plate 126 is coupled to the base plate 132 using posts 70 (FIG. 5A). Preferably, each post comprises a first member 72 slidably engaged with a second member 74. One member is coupled to the top plate and the other to the base plate. When the tilt pins are installed, the first member does not span the entire distance between the two plates. A gap 76 exists between the first member and one of the plates. The UUT and interface circuit board are then moved toward each other, causing the coaxial pins to buckle. This can be achieved by pushing on either or both the UUT and interface circuit board, using a mechanical device 80. Alternatively, this may be achieved by introducing a vacuum between the UUT and interface circuit board causing the two to move toward each other. The vacuum may be introduced by a vacuum means 82. Use of a mechanical device or vacuum means to move the plates toward each other is known in the art. As the plates are moved toward each other, the tilt pins buckle under Euler bucking (FIG. 4B). Euler buckling occurs when the load applied to a slim slender column, i.e., the pin, is at $P_{cr}$ which is equal to $4\pi^2$ $EI/l^2$, where E is the modulus of elasticity of the coaxial pin; I is the moment of inertia; and l is the free length 64 of the pin.

As the UUT and interface circuit board move toward each other, the two members of each post also slide relative to each other thereby closing the gap 76. Once the gap is closed (FIG. 5B), the UUT and interface circuit board can not move any further toward each other. Thus, the gap width can be tailored for limiting the buckling of the pins to a desired level.

Once buckled, the coaxial pins exert a compliant force against the test points on the UUT and the appropriate points on the interface circuit board. As a result, spring loaded probes are not required for exerting a compliant force on the pins for ensuring a positive contact between the pins and the test points on the UUT.

During Euler buckling the spacing between the central signal pins and the shields of each coaxial pin remain unchanged. Thus, although the buckling may alter the spacing between pins, the impedance of the coaxial pins remains unchanged. As such, use of the coaxial pins allows the interconnect of the this embodiment to be used to test a UUT at high frequencies.

An advantage of this embodiment is that it avoids the use of spring loaded probes in the test circuit. Consequently, the time and cost for having to appropriately space such probes on a compliant test interface for matching their impedance to that of the UUT are also reduced. As with the previous embodiment, the impedance of the interface circuit board also needs to be matched to the impedance of the UUT. Moreover, if ground pins are used, the impedance of the ground pins should also be matched to the impedance of the UUT.

In an alternate embodiment, the top plate may interface with a first circuit board (not shown) other than the UUT. In such an embodiment, the UUT is coupled or otherwise interfaces with the first circuit board. Similarly, the base plate may interface with a second circuit board (not shown). In such case, the second circuit board and the interface circuit board 158 will be coupled to, or otherwise interface with, each other.

What is claimed is:

1. A translator fixture for coupling a circuit board to be tested under high frequencies to test analyzer equipment for providing high frequency test signals, the fixture comprising:

a top plate for coupling with a circuit board to be tested;

a base plate for coupling with test analyzer equipment for providing a source of high frequency test signals; and a plurality of coaxial test pins supported by the top plate and the base plate, each test pin comprising a central solid pin comprising a first conical end opposite a second conical end and a body therebetween, wherein each coaxial pin further comprises a shield having a length and surrounding the central solid pin body and a non-conductive material surrounding the central solid pin and sandwiched between the central solid pin and shield wherein the non-conductive material spans the length of the shield, wherein each central pin first conical tip extends beyond the shield and extends to the top plate and wherein each central pin second conical tip extends beyond the shield and extends to the base plate for providing a test signal path from the test analyzer equipment to test points on the circuit board, said coaxial test pins having substantially the same impedance to facilitate impedance matching sufficient to effectively test the circuit board under high frequencies.

2. A fixture as recited in claim 1 wherein the non-conductive material extends beyond the shield.

3. A fixture as recited in claim 1 wherein the top and base plates are grounded, wherein the top and base plates have openings through their thickness, and wherein each coaxial pin shield is in contact with an opening circumferential wall on the top plate and in contact with an opening circumferential wall on the base plate, and wherein the central pin of each coaxial pin protrudes above an upper surface of the top plate and below a lower surface of the base plate.

4. A fixture as recited in claim 3 wherein the shield of each coaxial pin does not protrude above the upper surface of the top plate and below the lower surface of the base plate.

5. A fixture as recited in claim 3 further comprising a plurality of ground pins each ground pin having a first end penetrating an opening on the top plate for making contact with a test point on the circuit board being tested and a second end penetrating an opening on the base plate.

6. A fixture as recited in claim 3 further comprising:

a compliant test interface plate providing an interface between the base plate and the test equipment, the compliant test interface plate comprising a plurality of openings wherein each opening corresponds to an opening on the base plate; and a spring loaded probe in each compliant test interface plate opening for applying a force to the central pins extending through a corresponding opening below the lower surface of the base plate for causing the coaxial pin to make a positive contact with test points on the circuit board to be tested.

7. A fixture as recited in claim 6 further comprising a plurality of ground pins, each pin having a first end penetrating an opening on the top plate for contacting a test point on the circuit board to be tested and a second end penetrating an opening on the base plate and contacting a spring loaded probe.

8. A fixture as recited in claim 7 wherein the spacing between a spring loaded probe contacting a central pin and an adjacent spring loaded probe contacting a ground pin is arranged so as to yield an impedance through each of said probes matched to the impedance of the coaxial pins.

9. A fixture as recited in claim 8 wherein the impedance of the coaxial pins is selected for matching an impedance of the circuit board to be tested and an impedance of the test equipment.

10. A fixture as recited in claim 6 further comprising a test equipment circuit board coupled to a lower surface of the base compliant test interface plate, the test equipment circuit board having an impedance matched to an impedance of the test equipment, and the circuit board having contacts for contacting the spring loaded probes for providing an electrical path between the test equipment and the probes.

11. A fixture as recited in claim 1 wherein the impedance of each coaxial pin is about 50 ohms.

12. A fixture as recited in claim 1 further comprising a lower circuit board for coupling with the test equipment, the lower circuit board interfacing with a lower surface of the base plate and having contact points for providing an electrical path to the coaxial pins, wherein the pins are buckled for exerting a force against the contact points on the lower circuit board and on the test points on the circuit board to be tested.

13. A fixture as recited in claim 12 wherein the coaxial pins are Euler buckled.

14. A fixture as recited in claim 12 further comprising posts for supporting the top plate relative to the base plate, each post comprising:

a first member coupled to one of the plates; and a second member coupled to the other plate, the second member slidably engaging the first member thereby allowing the top plate to move relative to the base plate.

15. A fixture as recited in claim 14 wherein the posts limit the movement of one plate toward the other.

16. A circuit board test system comprising:

a first circuit board comprising a plurality of test points;

a second circuit board for interfacing with test signal providing equipment, the second circuit board comprising a plurality of signal points;

a translator fixture comprising, a top plate having an upper surface coupled to the first circuit board, the top plate comprising a plurality of openings, each opening communicating with a test point on the first circuit board, a base plate having a lower surface coupled to the second circuit board, the base plate located below and spaced apart from the top plate, the base plate comprising a plurality of openings, wherein each opening communicates with a signal point on the second circuit board, and a plurality of coaxial pins, each pin having a central pin coaxial with a generally cylindrical shield jacket, the jacket separated from the central pin by a non-conductive material, wherein at each end of each coaxial pin the central pin protrudes beyond the jacket, wherein each central pin first end penetrates an opening in the top plate and each central pin second end penetrates an opening in the base plate; and means for moving one of the circuit boards toward the other circuit board for causing the coaxial pins to buckle and thereby generate a force causing each of the central pin ends to positively contact a test point on the first circuit board and a signal point on the second circuit board thereby providing a signal path from the signal point to the test point, wherein when said coaxial pins buckle, their jackets and central pins buckle and the non-conductive material of each coaxial pin retains a space between said coaxial pin's central pin and jacket, thereby maintaining the impedance of the coaxial pins.

17. A system as recited in claim 16 wherein the pins undergo Euler buckling.

18. A system as recited in claim 17 wherein the means comprises a vacuum generating means causing one circuit board to move toward the other.

19. A system as recited in claim 17 wherein the means comprises a mechanical means for moving one circuit board toward the other.

20. A system as recited in claim 17 wherein the first board is a circuit board to be tested by the system.

21. A system as recited in claim 17 wherein the first circuit board, the second circuit board and the pins have a matched impedance.

22. A system as recited in claim 21 wherein the impedance of the coaxial pins is 50 ohms.

23. A circuit board test system comprising:

an electronic unit to be tested having a first array of contact points forming a first pattern;

a signal providing circuit board having a second array of contact points, the second array of contact points corresponding to the first array of contact points, the second array of contact points forming a second pattern different from the first pattern; and a plurality of coaxial tilt pins, each pin having an inner solid member surrounded by a shield and having a non-conductive material therebetween, wherein each solid member extends from opposite ends of the shield and from a contact point on the circuit board to a corresponding contact point on the unit.

24. A system as recited in claim 23 wherein the non-conductive material provides a spacing between solid member and the shield of each coaxial pin and wherein the coaxial pins are Euler buckled , wherein the solid member and the shield of each pin are buckled and wherein the non-conductive material retains the spacing between the central member and the shield of each coaxial pin.

25. A system as recited in claim 23 wherein the circuit board provides high frequency signals through the second array of contact points, the signals having a frequency not less than 100 Mhz.

26. A circuit board test system comprising:

a high frequency electronic unit to be tested having contact points for the transfer of high frequency signals having a frequency not less than 100 MHz, wherein the center of a first contact point is spaced from the center of a second contact point by a distance less than 0.07 inch;

a circuit board for providing high frequency test signals, the circuit board having contact points for the transfer of the high frequency signals;

a first coaxial contact pin having a first end coupled to the first contact point and a second end coupled to a contact point on the circuit board; and a second coaxial contact pin having a first end coupled to the second point and a second end coupled to a contact point on the circuit board.

27. A system as recited in claim 26 wherein the distance between the centers of the electronic unit first and second contact points is not greater than 0.025 inch.

28. A system as recited in claim 26 wherein the unit and pins have matched impedance.

29. A system as recited in claim 26 wherein the signals have a frequency not less than 1 Ghz.

30. A system as recited in claim 26 wherein the contact pins undergo Euler buckling.

* * * * *